(12) United States Patent
Kimura et al.

(10) Patent No.: US 8,150,642 B2
(45) Date of Patent: Apr. 3, 2012

(54) SECONDARY BATTERY DETERIORATION JUDGING DEVICE AND BACKUP POWER SUPPLY

(75) Inventors: Tadao Kimura, Hyogo (JP); Tatsuhiko Suzuki, Osaka (JP)

(73) Assignee: Panasonic Corporation, Osaka (JP)

( * ) Notice: Subject to any disclaimer, the term of this patent is extended or adjusted under 35 U.S.C. 154(b) by 372 days.

(21) Appl. No.: 12/516,529

(22) PCT Filed: Nov. 9, 2007

(86) PCT No.: PCT/JP2007/071775
§ 371 (c)(1),
(2), (4) Date: May 27, 2009

(87) PCT Pub. No.: WO2008/072436
PCT Pub. Date: Jun. 19, 2008

(65) Prior Publication Data
US 2010/0030498 A1 Feb. 4, 2010

(30) Foreign Application Priority Data
Dec. 14, 2006 (JP) .................................. 2006-336834

(51) Int. Cl.
*G01R 31/36* (2006.01)

(52) U.S. Cl. ........................................................ 702/63
(58) Field of Classification Search ..................... 702/63
See application file for complete search history.

(56) References Cited

U.S. PATENT DOCUMENTS

| | | | |
|---|---|---|---|
| 6,294,894 B1* | 9/2001 | Ochiai et al. | 320/132 |
| 6,453,249 B1* | 9/2002 | Shibutani et al. | 702/63 |
| 2002/0089308 A1* | 7/2002 | Sakurai | 320/134 |
| 2005/0017685 A1* | 1/2005 | Rees et al. | 320/132 |

FOREIGN PATENT DOCUMENTS

| | | |
|---|---|---|
| JP | 8-098418 | 4/1996 |
| JP | 2003-009406 | 1/2003 |
| JP | 2003-243042 | 8/2003 |
| JP | 2004-222427 | 8/2004 |

\* cited by examiner

*Primary Examiner* — Tung S Lau
(74) *Attorney, Agent, or Firm* — McDermott Will & Emery LLP

(57) ABSTRACT

A secondary battery deterioration judging device is provided with an overdischarge detecting section for detecting the overdischarge of a secondary battery, the deterioration of which is to be judged, a computing section for integrating a value indicating the deterioration of the secondary battery while the overdischarge is detected by the overdischarge detecting section, and a judging section for judging a deterioration state of the secondary battery based on an integration value obtained by the computing section.

6 Claims, 3 Drawing Sheets

SECONDARY BATTERY DETERIORATION JUDGING DEVICE AND BACKUP POWER SUPPLY

RELATED APPLICATIONS

This application is the U.S. National Phase under 35 U.S.C. §371 of International Application No. PCT/JP2007/071775, filed on Nov. 9, 2007, which in turn claims the benefit of Japanese Application No. 2006-336834, filed on Dec. 14, 2006, the disclosures of which Applications are incorporated by reference herein.

FIELD OF TECHNOLOGY

The present invention relates to a secondary battery deterioration judging device and a backup power supply.

BACKGROUND TECHNOLOGY

Secondary batteries are widely used as power supplies of mobile devices and backup power supplies. However, the secondary batteries are deteriorated by repeated charge and discharge, use at high temperature, overcharge and overdischarge. In the case of such deterioration of a secondary battery, problems such as the shortening of usable time and inability to do a necessary backup occur, wherefore it is important to judge the deterioration of the secondary battery.

A method for measuring a voltage drop for a current value at the time of discharge and calculating internal resistance of the secondary battery to judge a deteriorated state (see, for example, patent literature 1) and other methods have been proposed as secondary battery deterioration judging methods.

However, in the case of a backup power supply or the like, if deterioration is judged when the discharge is started as in patent literature 1, a sufficient discharge capacity cannot be obtained already at that point of time and the occurrence of a problem such as the shortage of a backup time cannot be avoided. Accordingly, measures such as the implementation of maintenance to perform discharge for regular deterioration judgments are necessary. Since the power supply cannot be backed up during the implementation of the maintenance to perform discharge for the deterioration judgment, there are problems such as the necessity to stop a backup function.
Patent Literature 1:
Japanese Unexamined Patent Publication No. 2003-243042

DISCLOSURE OF THE INVENTION

An object of the present invention is to provide a secondary battery deterioration judging device which needs not perform discharge only for a deterioration judgment and a backup power supply using such a judging device.

A deterioration judging device and a backup power supply according to one aspect of the present invention comprises an overdischarge detecting section for detecting the overdischarge of a secondary battery, the deterioration of which is to be judged; a computing section for integrating a value indicating the deterioration of the secondary battery while the overdischarge is detected by the overdischarge detecting section; and a judging section for judging a deterioration state of the secondary battery based on an integration value obtained by the computing section.

According to this construction, the overdischarge of the secondary battery, the deterioration of which is to be judged, is detected by the overdischarge detecting section. Further, the value indicating the deterioration of the secondary battery is integrated while the overdischarge of the secondary battery is detected by the overdischarge detecting section. Since the deterioration state of the secondary battery is judged by the judging section based on the integration value obtained by the computing section, the deterioration of the secondary battery can be judged without performing any discharge only for the deterioration judgment.

BEST MODES FOR EMBODYING THE INVENTION

Hereinafter, the principle of a secondary battery deterioration judgment according to the present invention is described before one embodiment of the present invention is specifically described.

Generally, deteriorations of a secondary battery are mainly caused by a decrease of an electrolyte by electrolysis and the passivation of active substances due to overcharge and also by a decrease of the electrolyte by electrolysis and the passivation and inactivation of active substances due to overdischarge in many cases.

As for the deterioration caused by overcharge out of these deteriorations, there is little likelihood of inducing a sudden deterioration since the secondary battery is designed to be resistant to overcharge more or less by optimizing a balance design of a positive electrode capacity and a negative electrode capacity. On the other hand, as for the deterioration caused by overdischarge, a degree of the deterioration is considerably larger than the one caused by overcharge since an electrochemical reaction totally different from the one in a normal state such as the reversal of a potential relationship of a positive electrode and a negative electrode at the time of overdischarge is induced.

A secondary battery used in a backup power supply has tended to have a larger size and a higher voltage with the development of informatization in recent years. Particularly, in the case of large power consumption, an increase in Joule heat generation of circuits and elements becomes problematic if an attempt is made to increase an output current. Thus, output power is generally increased while an increase of the output current is suppressed by increasing an output voltage.

In this case, the number of cells connected in series increases since the cell voltage of the secondary battery is electrochemically determined. However, if the cells are connected in series, a current flowing through all the cells connected in series is constant, wherefore a cell having a low SOC (state of charge) is overdischarged at a final stage of discharge due to differences in the SOC among the cells.

Accordingly, overdischarge needs to be avoided by overdischarge detecting means. However, if discharge is stopped upon the overdischarge of one cell, the discharge of the cells with remaining capacities is restricted even if the other cells have remaining capacities and have sufficient backup abilities. Therefore, there is a problem of restricting the ability of the entire power supply.

Thus, the prevent invention aims to enable a deterioration judgment so as to implement necessary battery maintenance at a suitable timing by precisely grasping the deterioration of a secondary battery caused by overdischarge while the ability of the entire power supply is maximally exhibited when a backup is necessary.

Figure 3:
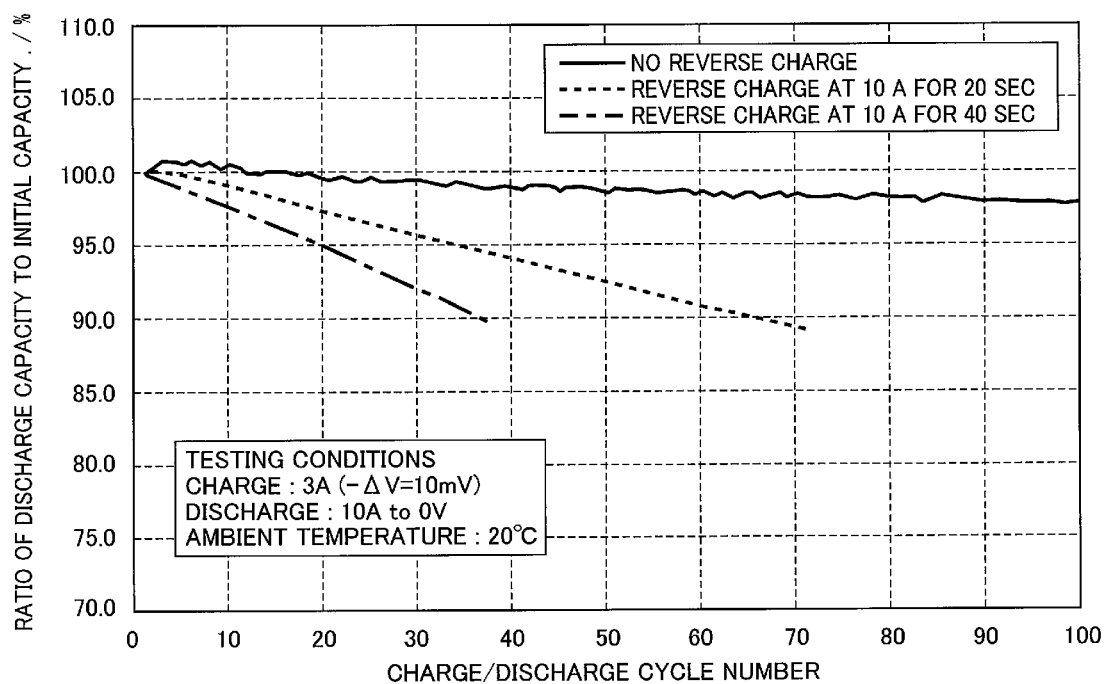
FIG. 3 is a graph showing a relationship between a charge/discharge cycle number and a discharge capacity of the secondary battery.

FIG. 3 is a graph showing an experimental result on a comparison between a case where a durability test is conducted while a secondary battery is overdischarged and a case where a durability test is conducted without the secondary battery being overdischarged. Batteries used in the durability tests are cylindrical nickel-hydrogen storage batteries of 3000 mAh. In ambient temperature 20° C., these batteries were fully charged by being charged until a battery voltage dropped by 10 mV from a peak value with a charge current set to 3 A, and were further discharged at a discharge current of 10 A until a terminal voltage dropped to 0 V.

The discharge of the secondary batteries not to be overdischarged was stopped here. The test was conducted for two types of secondary batteries to be overdischarged: those that were, thereafter, overdischarged for 20 sec. at 10 A and those that were overdischarged for 40 sec. Cells which were not overdischarged have capacities of 98% or higher of the initial capacity even after 100 cycles and were hardly deteriorated.

On the other hand, as for cells overdischarged at 10 A for 20 sec. in every discharge cycle, the discharge capacity dropped to 95% of the initial capacity in the $36^{th}$ Cycle and to 90% of the initial capacity in the $68^{th}$ cycle. As for cells overdischarged at 10 A for 40 sec. in each discharge cycle, the discharge capacity dropped to 95% of the initial capacity in the $20^{th}$ cycle and to 90% of the initial capacity in the $36^{th}$ cycle.

It is clear from this result that the overdischarge of the battery causes a sudden promotion of capacity deterioration. Further, since the cells overdischarged at 10 A for 40 sec. were deteriorated substantially twice as fast as those overdischarged at 1 OA for 20 sec., it is also clear that a good correlation can be found between the overdischarge amount and the deterioration.

Since the very good correlation is found between the overdischarge amount and the deterioration of the battery in this way, the deterioration of a secondary battery can be precisely grasped by detecting the overdischarge of the secondary battery and integrating time during which the overdischarge continues in such a case where a load current is virtually supposed. Further, if a variation of the load current is large and it is difficult to suppose a current value, the deterioration of the secondary battery can be precisely grasped by integrating a discharged electric amount obtained from the current at the time of discharge and an overdischarge time as an overdischarge duration.

Further, depending on the type of the battery, a discharge level may change stepwise and the cause of promoting the deterioration may differ at each level. In such a case, the deterioration of the secondary battery can be precisely judged by providing a plurality of judgment levels in overdischarge detecting means and integrating the overdischarge times and integrated overdischarge electric amounts judged at the respective judgment levels using different coefficients.

Hereinafter, best modes for embodying the present invention are described with reference to the drawings.

First Embodiment

Figure 1:
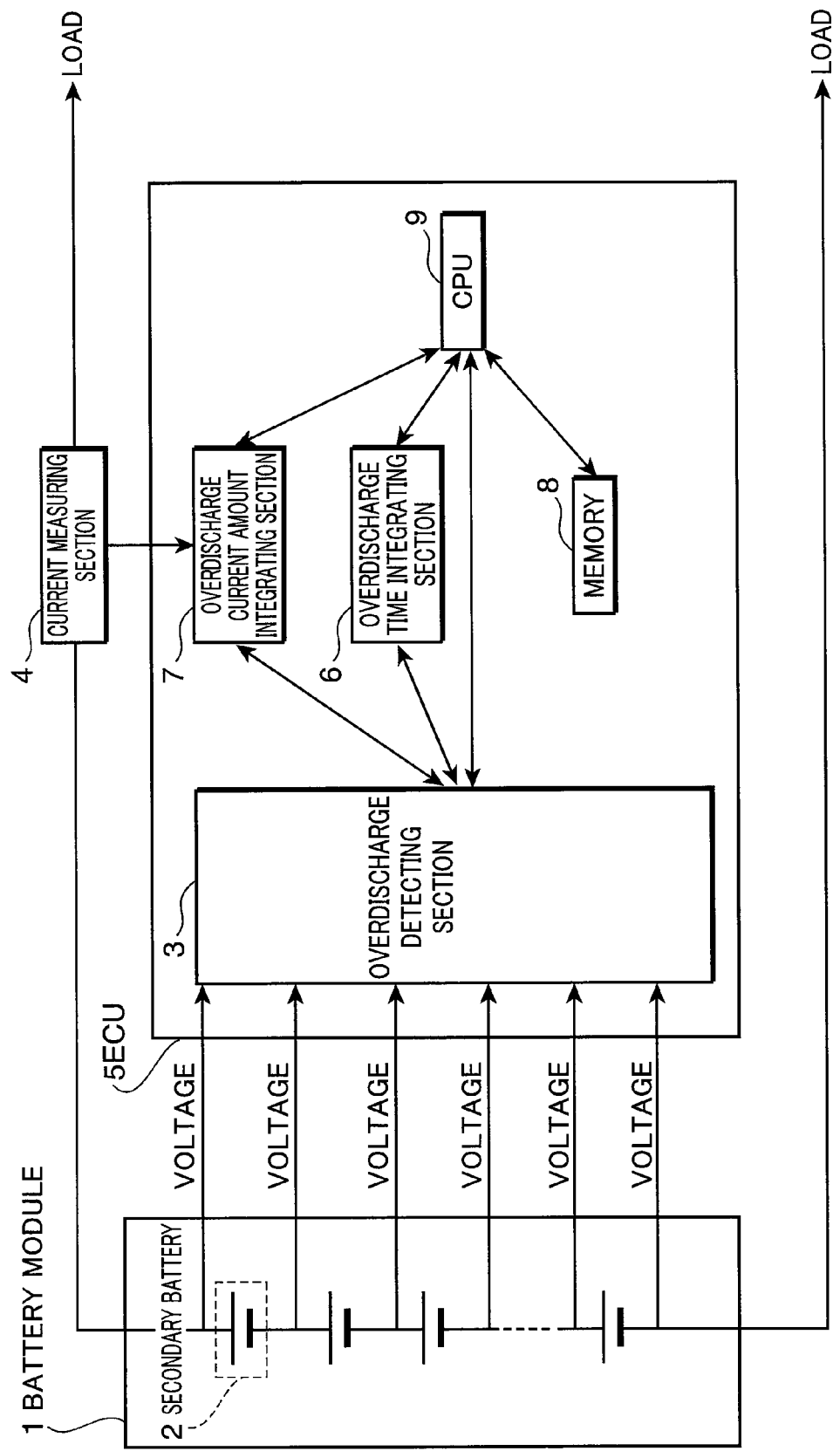
FIG. 1 is a schematic construction diagram of a system according to one embodiment of the invention.

FIG. 1 is a schematic construction diagram of a backup power supply system using a deterioration judging device according to a first embodiment of the present invention.

The backup power supply system shown in FIG. 1 includes a battery module 1, a current measuring section 4 and an ECU (Electric Control Unit) 5. In this case, an example of the deterioration judging device is constructed by the current measuring section 4 and the ECU 5.

The battery module 1 is connected in series with the current measuring section 4 and is also connected to a load. The battery module 1 is constructed by connecting at least one or more secondary batteries 2 in series. A voltage of the secondary battery 2 is connected with an input of an overdischarge detecting section 3 provided in the ECU 5.

The current measuring section 4 is connected to an overdischarge electric amount integrating section 7 in the ECU 5. A memory 8 and a CPU 9 (judging section) are further included in the ECU 5. The CPU 9 is connected to the memory 8, the overdischarge detecting section 3, the overdischarge electric amount integrating section 7, and an overdischarge time integrating section 6 in the ECU 5 to transmit and receive data and control the respective parts.

The overdischarge detecting section 3 measures voltages of the respective secondary batteries 2 and sends data of the voltage values to the CPU 9. The CPU 9 judges an overdischarge level based on the received voltage value data. The current measuring section 4 measures a discharge current or charge current of the battery module 1 and sends data of the charge/discharge current value to the overdischarge electric amount integrating section 7.

Upon discharge from the battery module 1 to the load, the voltage of the secondary battery 2 drops and consequently drops below an overdischarge voltage value V1 set beforehand. Then, the overdischarge detecting section 3 detects an overdischarge state and notifies it to the CPU 9. The CPU 9 causes the overdischarge time integrating section 6 to integrate the duration of the overdischarge state. In other words, the overdischarge time integrating section 6 (overdischarge time measuring section) measures a time during which the voltage of the secondary battery 2 is below the overdischarge current value V1 and assumes this integrated duration to be T1. Further, the overdischarge time integrating section 6 calculates A×T1, which is a value proportional to the integrated duration T1, as an integration value.

The CPU 9 uses A×T1, which is the value calculated by the overdischarge time integrating section 6 and proportional to the integrated duration T1, for the secondary battery deterioration judgment. Here, A is a coefficient indicating a deterioration degree when the voltage of the secondary battery 2 is equal to or below V1.

FIG. 3 shows a relationship between a battery capacity and an overdischarge time. As can be understood from this result, since the battery capacity is linearly related to a charge/discharge cycle number, i.e. the overdischarge time, the deterioration of the secondary battery 2 can be judged if the integration value A×T1 exceeds a predetermined value Z1. The CPU 9 judges whether or not the battery has been deteriorated by comparing the integration value A×T1 with the value Z1 stored in the memory 8.

Specifically, the CPU 9 judges the deterioration of the secondary battery 2 if the integration value A×T1 becomes equal to or larger than Z1 while judging no deterioration of the secondary battery 2 if the integration value A×T1 is below Z1.

Since the backup power supply shown in FIG. 1 judges the deterioration state of each secondary battery 2 from the integrated amount of the overdischarge time of the secondary battery 2 in this way, the deterioration of the secondary battery can be judged without implementing any maintenance to perform discharge for the deterioration judgment by stopping the backup function. Thus, a situation where the secondary battery is already deteriorated and a sufficient backup time cannot be obtained upon actually doing a backup between regularly implemented maintenances can be avoided beforehand.

When the secondary battery 2 is charged and the voltage exceeds V1 to exit from the overdischarge state, the CPU 9 causes the overdischarge time integrating section 6 to stop the integration operation and causes the duration T1 integrated by the overdischarge time integrating section 6 to be stored in the memory 8. The overdischarge time integrating section 6 starts integrating from the integrated duration T1 stored in the memory 8 upon restarting the integration of the overdischarge time.

Second Embodiment

Figure 2:
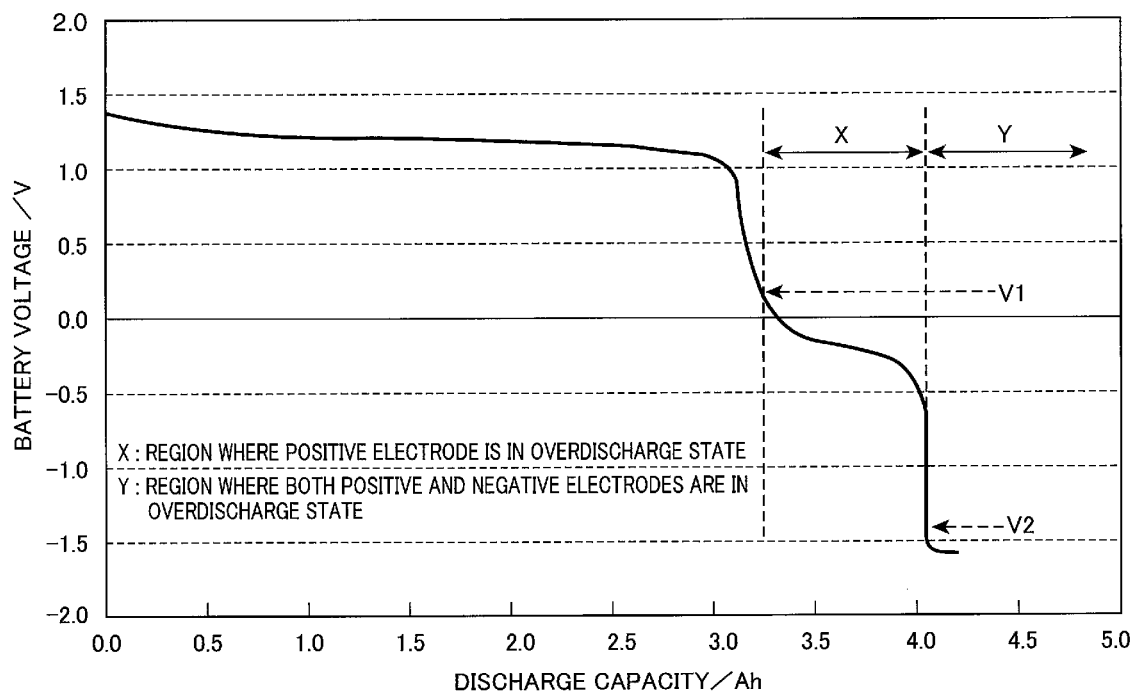
FIG. 2 is a graph showing a plurality of overcharge judgment levels and a voltage state of a secondary battery.

There are a plurality of overdischarge levels (degrees) of a secondary battery 2 according to the battery voltage of the secondary battery 2. FIG. 2 is a graph showing a plurality of overdischarge judgment levels and a state of the battery voltage of the secondary battery 2. In FIG. 2, two overdischarge levels are shown. When the secondary battery 2 is discharged, a positive electrode of the battery first enters an overdischarge state. A region X shown in FIG. 2 indicates this state.

When the discharge is further continued from this state and the battery voltage of the secondary battery 2 drops, transition is made to a region where both positive and negative electrodes are in the overdischarge state (Y of FIG. 2). It is assumed that the battery voltage is between V1 (inclusive) and V2 (inclusive) in the region X and below V2 in the region Y. In the respective states, a degree of influence on the deterioration of the battery differs. Accordingly, it is preferable to provide a plurality of coefficients for determining a deterioration degree and measure the duration in each overdischarge state.

Specifically, if T1 and T2 denote an integrated duration during which the battery voltage is between V1 (inclusive) and V2 (inclusive) and an integrated duration during which the battery voltage is below V2, the deterioration of the battery can be judged if the sum $A \times T1 + B \times T2$ of the integration values at the respective overdischarge levels exceeds a predetermined value Z2. Here, A and B are respectively coefficients indicating a deterioration degree (degree of deterioration) when the battery voltage is between V1 (inclusive) and V2 (inclusive) and a deterioration degree (degree of deterioration) when the battery voltage is below V2, and A<B.

In this case, the deterioration of the secondary battery 2 can be judged, considering the degree of influence on the deterioration of the battery depending on the degree of overdischarge, wherefore the accuracy of the deterioration judgment can be improved.

Although there are two overdischarge levels here, the number of set levels is not limited thereto and integrating operations may be performed while setting three or more levels.

Third Embodiment

The overdischarge deterioration of a secondary battery also depends on a discharge current in an overdischarge state. If the voltage of the secondary battery 2 drops to or below a predetermined value V1 and the overdischarge detecting section 3 detects the overdischarge of the secondary battery 2, the overdischarge detecting section 3 notifies it to the CPU 9 and the overdischarge electric amount integrating section 7 starts integrating the discharge electric amount using data of a battery module discharge current I sent from the current measuring section 4 in accordance with an instruction of the CPU 9.

If the discharge current I is constant, $C \times I \times T1$ proportional to a product of the overdischarge time T1 and the current I serves as an integration value of the overdischarge electric amount and indicates the deterioration degree of the battery. The deterioration of the battery is judged when the integration value of the overdischarge electric amount obtained in this way exceeds a predetermined value Z3. Here, C is a coefficient indicating a deterioration degree (degree of deterioration) when the voltage of the secondary battery is equal to or below V1.

Since the discharge current is not always constant, the current measuring section 4 measures the current in each predetermined cycle. If $\Delta t$ denotes a measurement cycle, N the number of current measurements made during the overdischarge duration, $I(k)$ a $k^{th}$ current measurement value and Z0 a deterioration degree before the overdischarge detection this time, a new integration value is calculated to be $Z0+C \times (I(1)+I(2)+ \ldots +I(N-1)+I(N)) \times \Delta t$ by the overdischarge electric amount integrating section 7.

The CPU 9 judges the deterioration of the battery when the new integration value obtained in this way exceeds the predetermined value Z3.

Fourth Embodiment

The deterioration of a battery is influenced by an overdischarge state which can be judged form a battery voltage, a discharge current at that time and the duration of the overdischarge state. Depending on an operation condition of a system, even if some of batteries constituting a battery system (backup power supply) enter an overdischarge state, but the other batteries are not yet overdischarged, there are cases where the system preferably rather continues to be operated without being stopped.

Now, if it is assumed that T1 denotes a duration until the voltage of a secondary battery drops from V1 to V2 after dropping to V1, T2 a duration during which the voltage is below V, and I a discharge current, the deterioration of the secondary battery at this time is calculated to be $C \times I \times T1 + D \times I \times T2$ by the overdischarge electric amount integrating section 7.

The CPU 9 judges the deterioration of the battery if the value $C \times I \times T1 + D \times I \times T2$ calculated by the overdischarge electric amount integrating section 7 exceeds a predetermined value Z3. Here, C and D are respectively coefficients indicating a deterioration degree (degree of deterioration) until the battery voltage of the secondary battery drops from V1 to V2 and a deterioration degree (degree of deterioration) when the battery voltage of the secondary battery is below V2, and C<D.

As also described in the third embodiment, the discharge current is not always constant. If $\Delta t$ denotes a current measurement cycle by the current measuring section 4, N the number of current measurements made in an overdischarge state where the voltage of the secondary battery is between V1 and V2, M the number of current measurements made in an overdischarge state where the voltage of the secondary battery is below V2, $I(k)$ a $k^{th}$ current measurement value and Z0 a deterioration degree before the overdischarge detection this time, a new integration value is calculated to be $Z0+C \times (I(1)+I(2)+ \ldots +I(N-1)+I(N)) \times \Delta t + D \times (I(1)+I(2)+ \ldots +I(M-1)+I(M)) \times \Delta t$ by the overdischarge electric amount integrating section 7.

The CPU 9 judges the deterioration of the battery when the new integration value calculated by the overdischarge electric amount integrating section 7 exceeds the predetermined value Z3.

A computing section as claimed is equivalent to the overdischarge time integrating section 6, the overdischarge electric amount integrating section 7 or a combination of the overdischarge time integrating section 6 and the overdischarge electric amount integrating section 7.

A deterioration judging device according to one aspect of the present invention comprises an overdischarge detecting section for detecting the overdischarge of a secondary battery, the deterioration of which is to be judged; a computing section for integrating a value indicating the deterioration of the secondary battery while the overdischarge is detected by the overdischarge detecting section; and a judging section for judging a deterioration state of the secondary battery based on an integration value obtained by the computing section.

According to this construction, the overdischarge of the secondary battery, the deterioration of which is to be judged, is detected by the overdischarge detecting section. Further, the value indicating the deterioration of the secondary battery is integrated while the overdischarge of the secondary battery is detected by the overdischarge detecting section. Since the deterioration state of the secondary battery is judged by the judging section based on the integration value obtained by the computing section, the deterioration of the secondary battery can be judged without performing any discharge only for the deterioration judgment.

It is preferable that an overdischarge time measuring section for measuring a period during which the overdischarge is detected by the overdischarge detecting section as an overdischarge time is further provided; and that the computing section integrates the overdischarge time measured by the overdischarge time measuring section as the value indicating the deterioration of the secondary battery.

According to this construction, the period during which the overdischarge is detected by the overdischarge detecting section is measured as the overdischarge time by the overdischarge time measuring section. The overdischarge time measured by the overdischarge time measuring section is integrated as the value indicating the deterioration of the secondary battery by the computing section. Since the overdischarge time is correlated with the deterioration of the secondary battery, the integration value of the overdischarge time is preferable as the value indicating the deterioration of the secondary battery.

It is preferable that a judgment level used to judge the degree of overdischarge is set beforehand; that the overdischarge detecting section detects the degree of overdischarge based on the judgment level; that the computing section obtains the value indicating the deterioration of the secondary battery by multiplying the overdischarge time measured by the overdischarge time measuring section by a coefficient indicating the degree of overdischarge detected by the overdischarge detecting section; and that the coefficient is set to increase as the degree of overdischarge increases.

According to this construction, the degree of overdischarge is detected by the overdischarge detecting section based on the judgment level used to judge the degree of overdischarge. Further, the computing section obtains the value indicating the deterioration of the secondary battery by multiplying the overdischarge time by the coefficient set to increase as the degree of overdischarge detected by the overdischarge detecting section increases. In this case, since the overdischarge time is integrated as the value indicating the deterioration of the secondary battery in consideration of the degree of overdischarge, accuracy in judging the deterioration of the secondary battery is improved.

A current measuring section for measuring the value of a current flowing in the secondary battery may be further provided, and the computing section may integrate the current value measured by the current measuring section while the overdischarge is detected by the overdischarge detecting section as the value indicating the deterioration of the secondary battery.

According to this construction, the value of the current flowing in the secondary battery is measured by the current measuring section. Further, the current value measured by the current measuring section while the overdischarge is detected by the overdischarge detecting section is integrated as the value indicating the deterioration of the secondary battery by the computing section. Since the current value in the overdischarge state is correlated with the deterioration of the secondary battery, the integration value of such a current value is preferable as the value indicating the deterioration of the secondary battery.

It is preferable that a judgment level used to judge the degree of overdischarge is set beforehand; that the overdischarge detecting section detects the degree of overdischarge based on the judgment level; that the computing section obtains the value indicating the deterioration of the secondary battery by multiplying the current value measured by the current measuring section while the overdischarge is detected by the overdischarge detecting section by a coefficient indicating the degree of overdischarge detected by the overdischarge detecting section; and that the coefficient is set to increase as the degree of overdischarge increases.

According to this construction, the degree of overdischarge is detected by the overdischarge detecting section based on the judgment level used to judge the degree of overdischarge. Further, the computing section obtains the value indicating the deterioration of the secondary battery by multiplying the current value measured by the current measuring section while the overdischarge is detected by the overdischarge detecting section by the coefficient set to increase as the degree of overdischarge of the secondary battery increases. In this case, since the value of the current flowing in the secondary battery is integrated as the value indicating the deterioration of the secondary battery in consideration of the degree of overdischarge, accuracy in judging the deterioration of the secondary battery is improved.

The overdischarge detecting section preferably detects the overdischarge of the secondary battery when a terminal voltage of the secondary battery drops below an overdischarge voltage value set beforehand.

Since the terminal voltage of the secondary battery decreases as the discharge proceeds, the construction of the overdischarge detecting section can be easily simplified by detecting the overdischarge of the secondary battery based on whether or not the terminal voltage of the secondary battery is below the overdischarge voltage value set beforehand.

It is preferable that the judgment level is a voltage value set to decrease as the degree of overdischarge increases; and that the overdischarge detecting section detects the degree of overdischarge based on a comparison result of the terminal voltage of the secondary battery and the judgment level.

Since the terminal voltage of the secondary battery decreases as the discharge proceeds, the overdischarge detecting section can easily detect the degree of overdischarge based on the comparison result of the terminal voltage of the secondary battery and the judgment level by setting the voltage value set to decrease as the degree of overdischarge increases as the judgment level.

Further, a backup power supply according to one aspect of the present invention comprises a secondary battery; an overdischarge detecting section for detecting the overdischarge of the secondary battery; a computing section for integrating a value indicating the deterioration of the secondary battery while the overdischarge is detected by the overdischarge detecting section; and a judging section for judging a deterioration state of the secondary battery based on the integration value obtained by the computing section.

According to this construction, the overdischarge of the secondary battery is detected by the overdischarge detecting section. Further, while the overdischarge of the secondary battery is detected by the overdischarge detecting section, the value indicating the deterioration of the secondary battery is integrated by the computing section. Since the deterioration state of the secondary battery is judged based on the integration value obtained by the computing section, the deterioration of the secondary battery can be judged without performing any discharge only for a deterioration judgment.

INDUSTRIAL APPLICABILITY

The present invention is useful for a secondary battery deterioration judgment and has a profound effect particularly when being used in a backup power supply.

What is claimed is:

1. A secondary battery deterioration judging device, comprising:
an overdischarge detecting section for detecting a terminal voltage of a secondary battery of which a deterioration is to be judged, determining whether the detected terminal voltage is equal to or less than a predetermined voltage value, and detecting an overdischarge state of the secondary battery when the detected terminal voltage is equal to or less than the predetermined voltage value;
a computing section for integrating a value indicating the deterioration of the secondary battery while the overdischarge state is detected by the overdischarge detecting section; and
a judging section for judging a deterioration state of the secondary battery based on an integration value obtained by the computing section, wherein
the overdischarge detecting section includes, as the predetermined voltage value, a first voltage value which is a positive value or zero and a second voltage value which is less than zero, and detects a first overdischarge state of the secondary battery when the detected terminal voltage is equal to or less than the first voltage value and equal to or more than the second voltage value, and detects a second overdischarge state of the secondary battery when the detected terminal voltage is less than the second voltage value.

2. A secondary battery deterioration judging device according to claim 1, further comprising an overdischarge time measuring section for measuring a period during which the first overdischarge state is detected by the overdischarge detecting section as a first overdischarge time and a period during which the second overdischarge state is detected by the overdischarge detecting section as a second overdischarge time, wherein
the computing section integrates the first overdischarge time measured by the overdischarge time measuring section as a first value indicating the deterioration of the secondary battery, and integrates the second overdischarge measured by the overdischarge time measuring section as a second value indicating the deterioration of the secondary battery, and
the judging section judges the deterioration state of the secondary battery based on the integration value of the first value and the integration value of the second value obtained by the computing section.

3. A secondary battery deterioration judging device according to claim 2, wherein:
the computing section obtains the integration value of the first value indicating the deterioration of the secondary battery by multiplying the first overdischarge time measured by the overdischarge time measuring section by a first coefficient corresponding to the first overdischarge state detected by the overdischarge detecting section, and obtains the integration value of the second value indicating the deterioration of the secondary battery by multiplying the second overdischarge time measured by the overdischarge time measuring section by a second coefficient corresponding to the second overdischarge state detected by the overdischarge detecting section; and
the second coefficient is set to a value greater than the first coefficient.

4. A secondary battery deterioration judging device according to claim 1, further comprising a current measuring section for measuring the value of a current flowing in the secondary battery, wherein
the computing section integrates the current value measured by the current measuring section while the first overdischarge state is detected by the overdischarge detecting section as a first value indicating the deterioration of the secondary battery, and integrates the current value measured by the current measuring section while the second overdischarge state is detected by the overdischarge detecting section as a second value indicating the deterioration of the secondary battery, and
the judging section judges the deterioration state of the secondary battery based on the integration value of the first value and the integration value of the second value obtained by the computing section.

5. A secondary battery deterioration judging device according to claim 4, wherein:
the computing section obtains the integration value of the first value indicating the deterioration of the secondary battery by multiplying the current value measured by the current measuring section while the first overdischarge state is detected by the overdischarge detecting section by a first coefficient corresponding to the first overdischarge state detected by the overdischarge detecting section, and obtains the integration value of the second value indicating the deterioration of the secondary battery by multiplying the current value measured by the current measuring section while the second overdischarge state is detected by the overdischarge detecting section by a second coefficient corresponding to the second overdischarge state detected by the overdischarge detecting section; and
the second coefficient is set to a value greater than the first coefficient.

6. A backup power supply, comprising:
a secondary battery;
an overdischarge detecting section for detecting a terminal voltage of the secondary battery, determining whether the detected terminal voltage is equal to or less than a predetermined voltage value, and detecting an overdischarge state of the secondary battery when the detected terminal voltage is equal to or less than the predetermined voltage value;

a computing section for integrating a value indicating the deterioration of the secondary battery while the overdischarge state is detected by the overdischarge detecting section; and a judging section for judging a deterioration state of the secondary battery based on the integration value obtained by the computing section, wherein the overdischarge detecting section includes as the predetermined voltage value, a first voltage value which is a positive value or zero and a second voltage value which is less than zero, and detects a first overdischarge state of the secondary battery when the detected terminal voltage is equal to or less than the first voltage value and equal to or more than the second voltage value, and detects a second overdischarge state of the secondary battery when the detected terminal voltage is less than the second voltage value.

* * * * *